United States Patent [19]
Ziegner et al.

[11] Patent Number: 5,783,857
[45] Date of Patent: Jul. 21, 1998

[54] INTEGRATED CIRCUIT PACKAGE

[75] Inventors: Bernhard Alphonso Ziegner, Westford, Mass.; Robert John Sletten, Bow, N.H.

[73] Assignee: The Whitaker Corporation, Wilmington, Del.

[21] Appl. No.: 690,418

[22] Filed: Jul. 25, 1996

[51] Int. Cl.$^6$ .................................................. H01L 29/40
[52] U.S. Cl. ........................ 257/664; 257/698; 257/700
[58] Field of Search ................................ 257/664, 728, 257/698, 700

[56] References Cited

U.S. PATENT DOCUMENTS

| | | | |
|---|---|---|---|
| 3,628,105 | 12/1971 | Sakai | 257/664 |
| 4,891,687 | 1/1990 | Mallik et al. | 257/664 |
| 5,089,878 | 2/1992 | Lee | 257/664 |
| 5,214,845 | 6/1993 | King et al. | 257/664 |
| 5,223,739 | 6/1993 | Katsumata et al. | 257/676 |
| 5,235,300 | 8/1993 | Chan et al. | 333/247 |
| 5,266,746 | 11/1993 | Nishihara et al. | 174/254 |
| 5,294,897 | 3/1994 | Notani et al. | 333/33 |
| 5,420,460 | 5/1995 | Massingill | 257/693 |
| 5,426,319 | 6/1995 | Notani | 257/275 |
| 5,455,453 | 10/1995 | Harada et al. | 257/675 |

FOREIGN PATENT DOCUMENTS

| | | | |
|---|---|---|---|
| 63-258054 | 10/1988 | Japan | 257/664 |
| 3136358 | 6/1991 | Japan | 257/728 |
| 5-63118 | 3/1993 | Japan | 251/664 |

OTHER PUBLICATIONS

A New Leadframeless IC Carrier Package Using Metal Base Substrate; 6 pages.
Metal Quad Package (MQP) ; 15 Pages.
Life Over 30 GHZ; 3 Pages.

Primary Examiner—Mahshid D. Saadat
Assistant Examiner—S. V. Clark

[57] ABSTRACT

An IC package appropriate for microwave devices, integrated circuits, multichip modules, and hybrid circuit assemblies and power devices comprises an outer interconnect (2) and an inner interconnect (3). Lead lines (8) on an outer interconnect (2) are in electric engagement with respective access lines (13) on an inner interconnect (3). Contacts (21) of an IC are electrically interconnected with the access lines (13) on the inner interconnect (3). A package according to the teachings of the present invention provides for efficient heat dissipation from the package interior and an efficient electrical transition from the interior of a package.

29 Claims, 10 Drawing Sheets

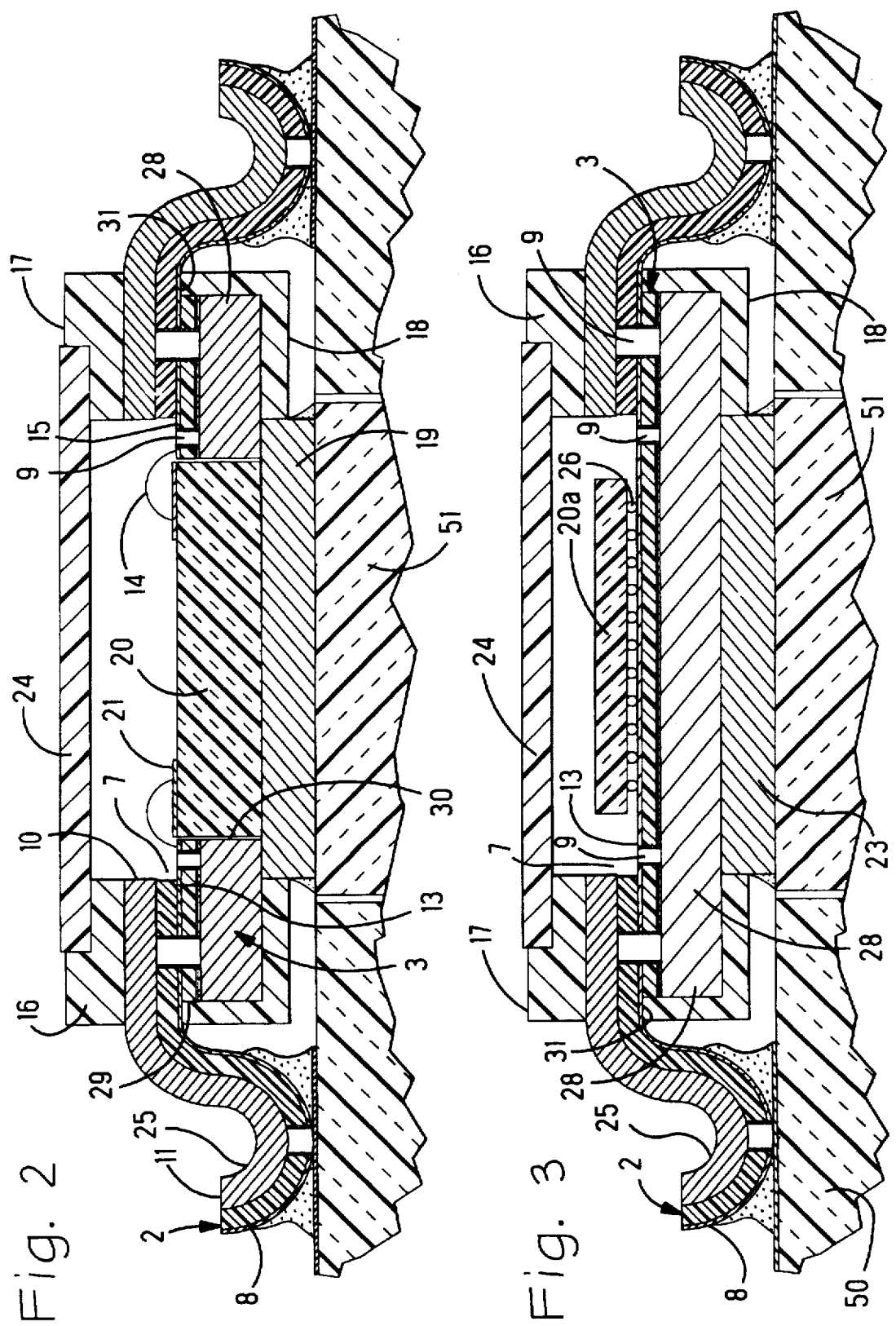

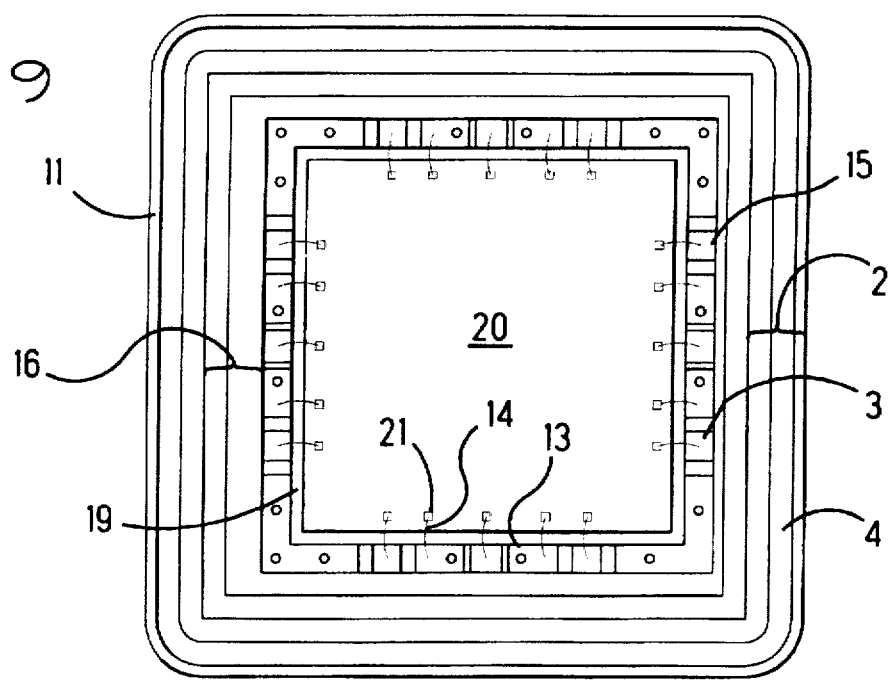
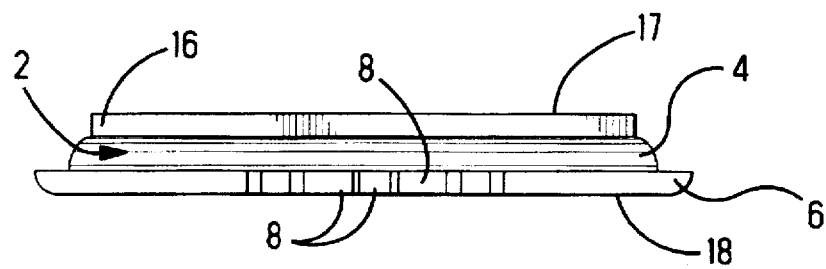
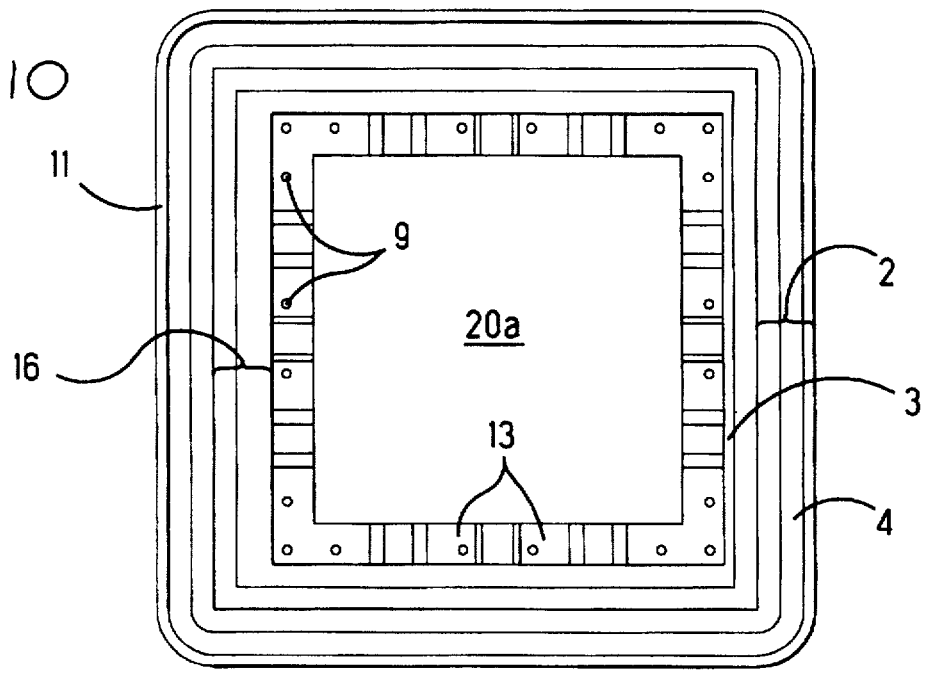

INTEGRATED CIRCUIT PACKAGE

FIELD OF THE INVENTION

The present invention relates to integrated circuit packages and more specifically to a low cost microwave integrated circuit package.

BACKGROUND OF THE INVENTION

Microwave devices and integrated circuits appropriate for numerous communication applications, have been known for sometime. A common package for microwave semiconductor devices, integrated circuits, multichip modules or a hybrid circuit assembly (referred to herein generally as an "IC") is the ceramic package. Ceramic packages advantageously provide an air dielectric for the IC within the package. A ceramic package provides a continuous interconnection path from the interior of the package to the exterior of the package. As frequency increases, the interconnection path between the IC and an exterior lead of the ceramic package has an increasingly significant impact on the performance of the packaged IC. Modifications to the geometry of the leads extending between the interior and the exterior of the package can be made to provide a constant characteristic impedance over the transition. One modification is to reduce the width of the transmission line as it traverses through the ceramic from the interior to the exterior of the package. A challenge associated with these modifications is exacerbated at millimeter wave frequencies. At the higher frequencies, the appropriate width of the transmission line in a ceramic package is sufficiently reduced so as to raise attenuation per unit length and, consequently, reduces design options. In addition, the ceramic package is costly to manufacture and assemble. There is a need, therefore, for an alternative package appropriate for high frequency integrated circuits that addresses the foregoing challenges.

It is also known to package microwave ICs into lower cost plastic packages similar to those used for digital ICs using transfer molding or similar post mold techniques. The effectiveness of plastic packages using a standard lead frame is limited by the lack of a constant impedance transition from the microwave signal input and output ports through the package to the IC. The inability to provide a specific and constant impedance throughout the entire transition length limits the upper signal frequencies that can be used with the package. Additionally, parasitic capacitance and inductance, inherent in uncontrolled transition structures, also results in an upper limit to the useful signal frequency. Additionally, the presence of the molding compound adjacent to the IC surface is known to reduce the performance of the IC. It would be desirable to have a low cost package suitable for high frequency ICs.

There is known an integrated circuit package having a layered lead structure comprising a transmission layer, an insulating layer, and a base layer. The base layer is a relatively thick layer of copper. The insulating layer is a polyimide dielectric layer laminated onto the base layer. The transmission layer comprises multiple copper foil conductive traces that have been patterned onto the insulating layer. Such a laminated structure is commercially available from Mitsui Toatsu Chemicals Inc. under the trademark KOOL-BASE®. The layered lead structure is press formed to have radiused ends on a perimeter thereof. The lead structure retains its shape due to the strength and memory of the copper metal base layer. The press form results in an indentation at a center of the lead structure. An IC is attached to the center and wirebonded to the conductive traces. The indentation is then filled with molding compound to complete the package. Attachment to a printed wiring board is by way of engagement between the radiused portion of the lead along a line tangent to the radius and a surface on the printed wiring board. Attachment to a printed wiring board may be made by way of conventional surface mount solder manufacturing techniques. This style of package is termed an integrated leadless chip carrier (ILCC).

The ILCC package is not, however, appropriate for microwave integrated circuits due to the use of molded packaging and poor heat removal. In particular, the ILCC package is inappropriate for high powered ICs. Microwave integrated circuits, particularly power devices, generate a significant amount of heat. Sufficient heat dissipation is, therefore, important to a reliable part. In the ILCC style package, heat must dissipate through the transmission lines to the printed circuit board and/or through the insulating layer to the copper base layer for dissipation through the air. Dissipation of heat by way of relatively narrow transmission lines or through an insulating layer is insufficient to properly cool some ICs. Accordingly, there is a need for an integrated circuit package with improved heat dissipation capabilities.

There is need, therefore, for a low cost reliable package appropriate for microwave semiconductors and capable of efficient heat dissipation.

SUMMARY OF THE INVENTION

A package for an IC comprises an inner and outer interconnect. Each interconnect comprises a transmission layer, an insulating layer, and a base layer. The outer interconnect is electrically connected to the inner interconnect and the, IC is electrically connected to the inner interconnect.

BRIEF DESCRIPTION OF THE DRAWINGS

FIG. 2 is an assembled cross-section of a packaged IC.

FIG. 3 is an assembled cross-section of an alternate embodiment of a packaged IC according to the teachings of the present invention.

FIG. 9 is a planar top view of a packaged IC.

FIG. 10 is a planar top view of an alternate embodiment of a packaged IC.

FIG. 11 is a planar side view of a packaged IC.

DETAILED DESCRIPTION OF THE INVENTION

A packaged IC according to the teachings of the present invention comprises an outer interconnect (2) and an inner interconnect (3). Both the outer and the inner interconnect (2,3) are layered structures comprising a base layer, an insulating layer, and a transmission layer.

Figure 1:
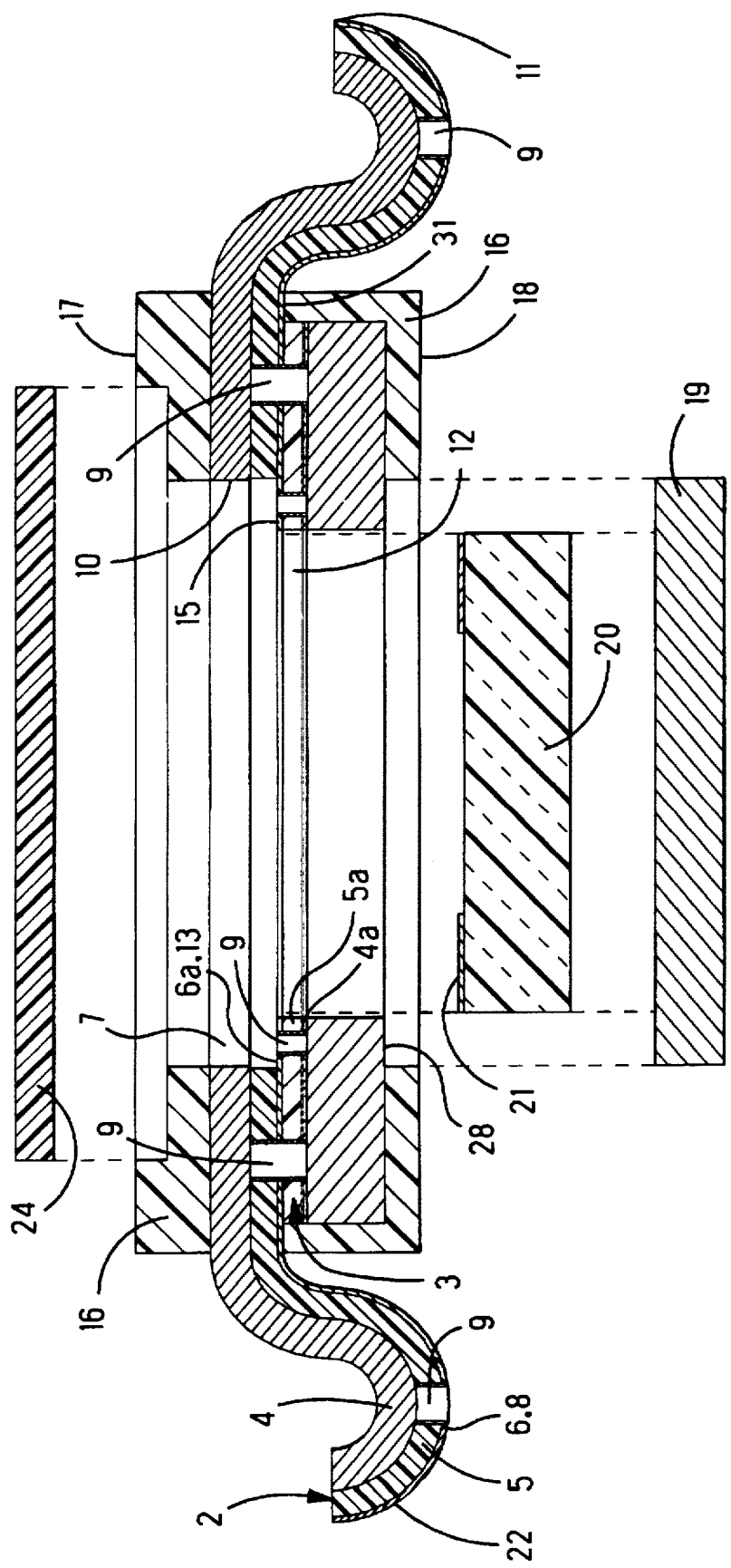
FIG. 1 is an exploded cross-section of a packaged IC.
Figure 4:
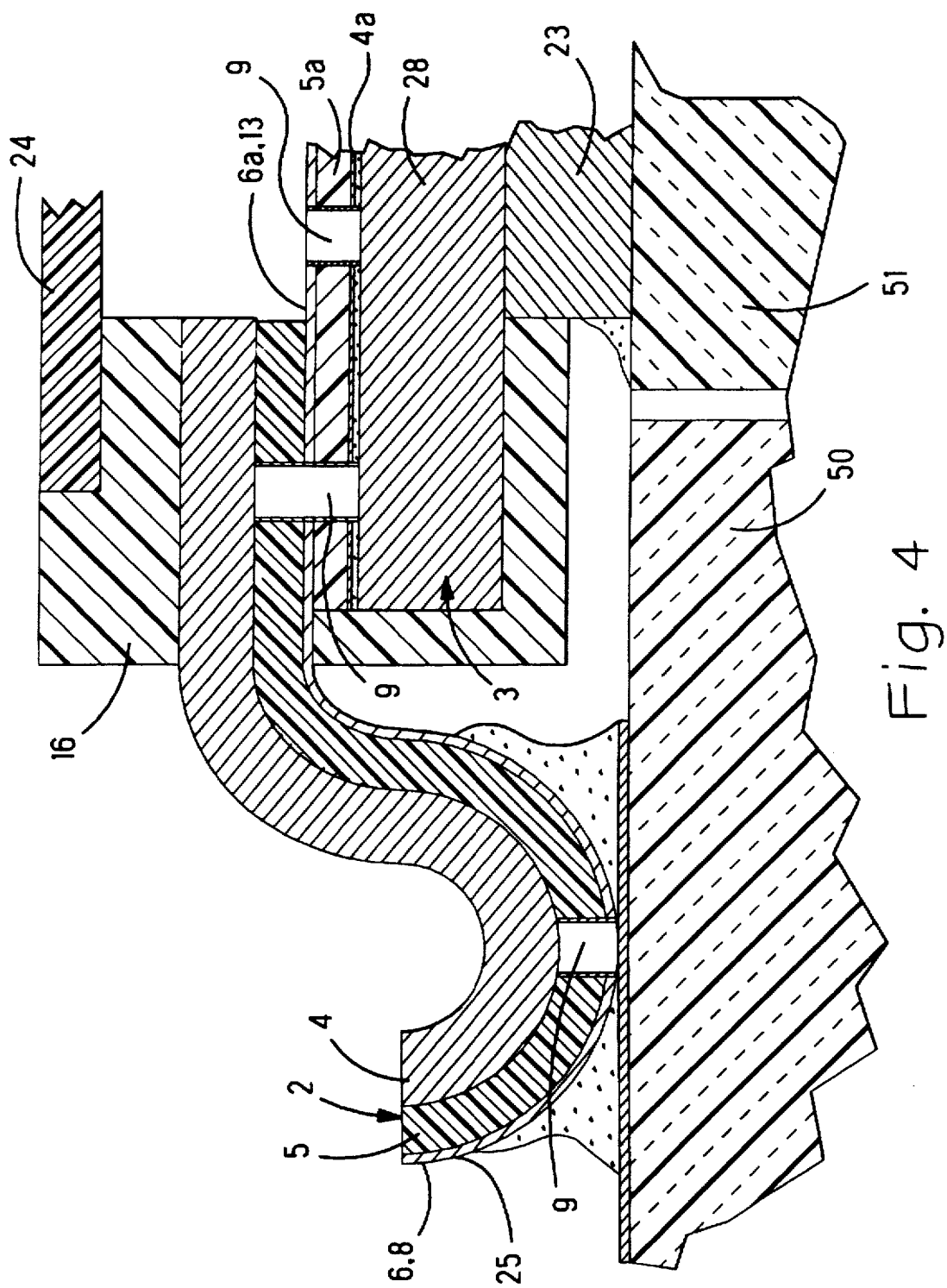
FIG. 4 is a detailed cross-section of a lead in a packaged IC.
Figure 6:
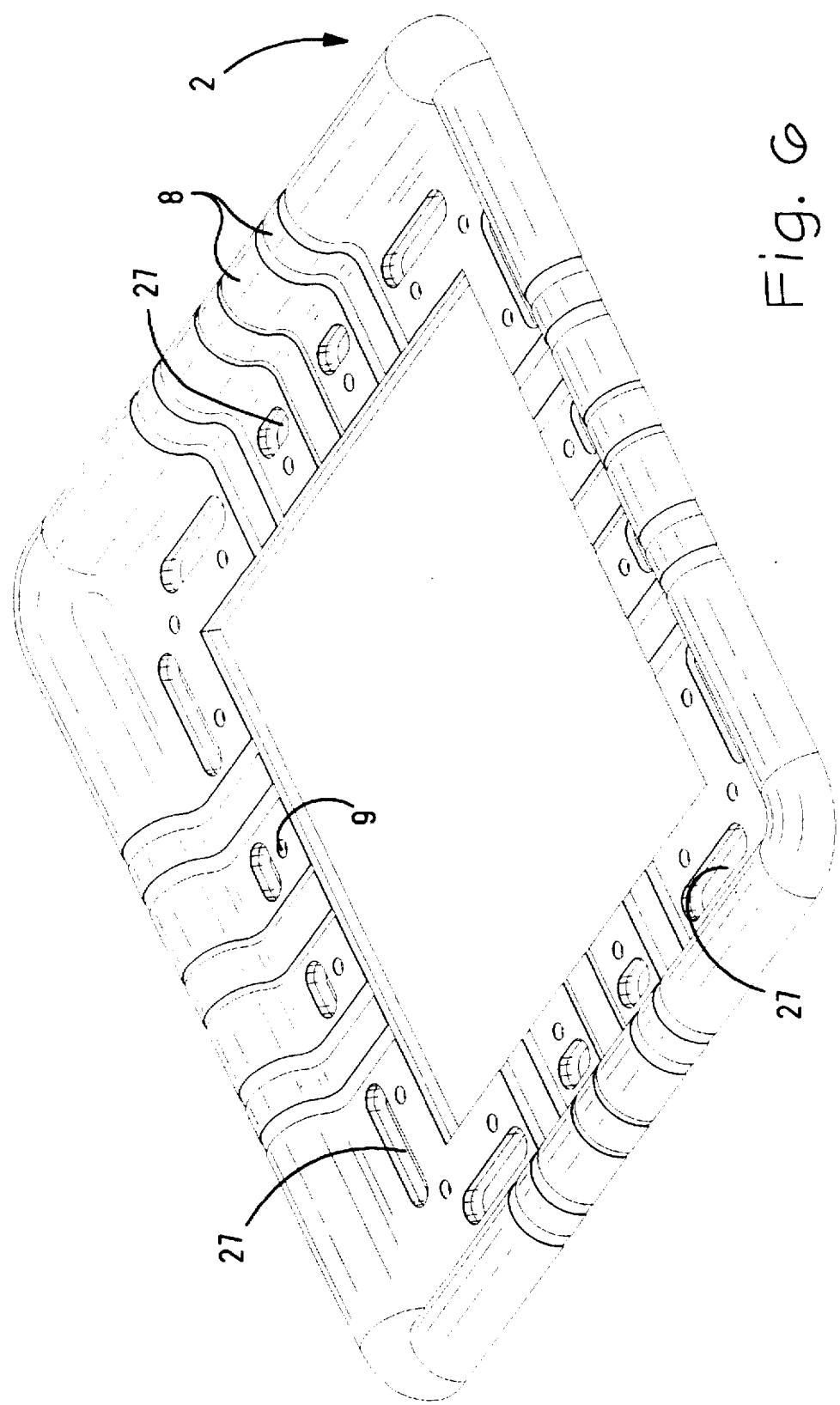
FIG. 6 is a perspective view of an outer interconnect with the side that engages the inner interconnect shown in FIG. 5 facing up.
Figure 7:
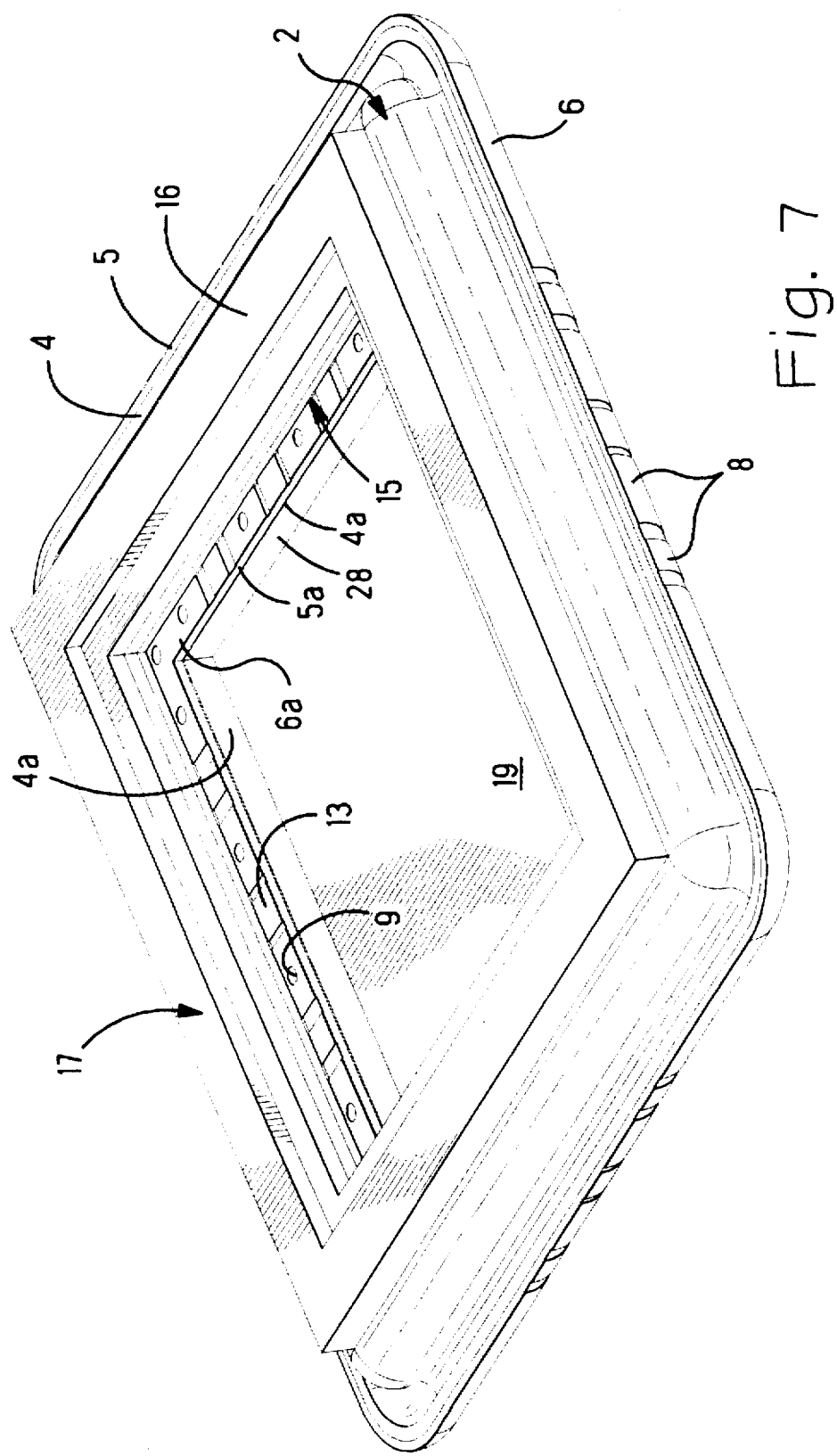
FIG. 7 is a perspective view from the top of an IC package with the cover off and prior to receipt of an IC.
Figure 8:
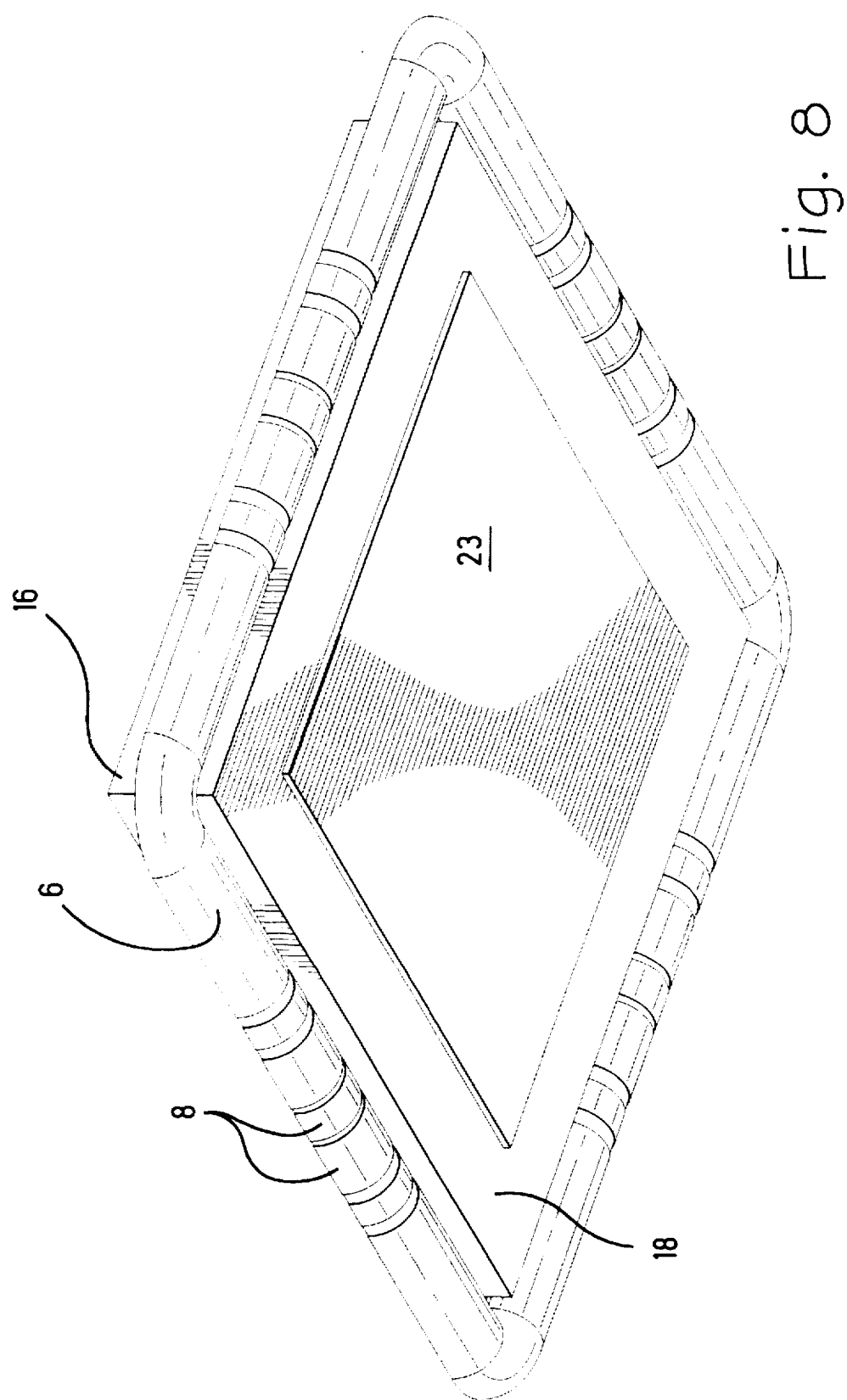
FIG. 8 is a perspective view from the bottom of an IC package.

With specific reference to FIGS. 1, 2 and 6 of the drawings, the base layer (4) of the outer interconnect (2) comprises a relatively thick copper metal substrate. Its thickness is on the order of 200 microns. The insulating layer (5) having a thickness of 20 to 45 microns is made of a laminated polyimide dielectric that covers the base layer (4). Gold plated copper foil lead lines (8) patterned onto the insulating layer (5) comprise the transmission layer (6). The lead lines (8) are 5 to 20 microns thick. The lead lines (8) of the transmission layer (6) form leads (22) of the packaged IC. The lead lines (8) are patterned onto the insulating layer (5) using conventional printed wiring board manufacturing techniques. In a preferred embodiment, the outer interconnect (2) is made of the KOOL-BASE® Packaging System lead structure. In a device specific implementation, one or more vias (9) may be formed interconnecting some of the lead lines (8) of the transmission layer (6) and the base layer (4) of the outer interconnect (2).

Figure 5:
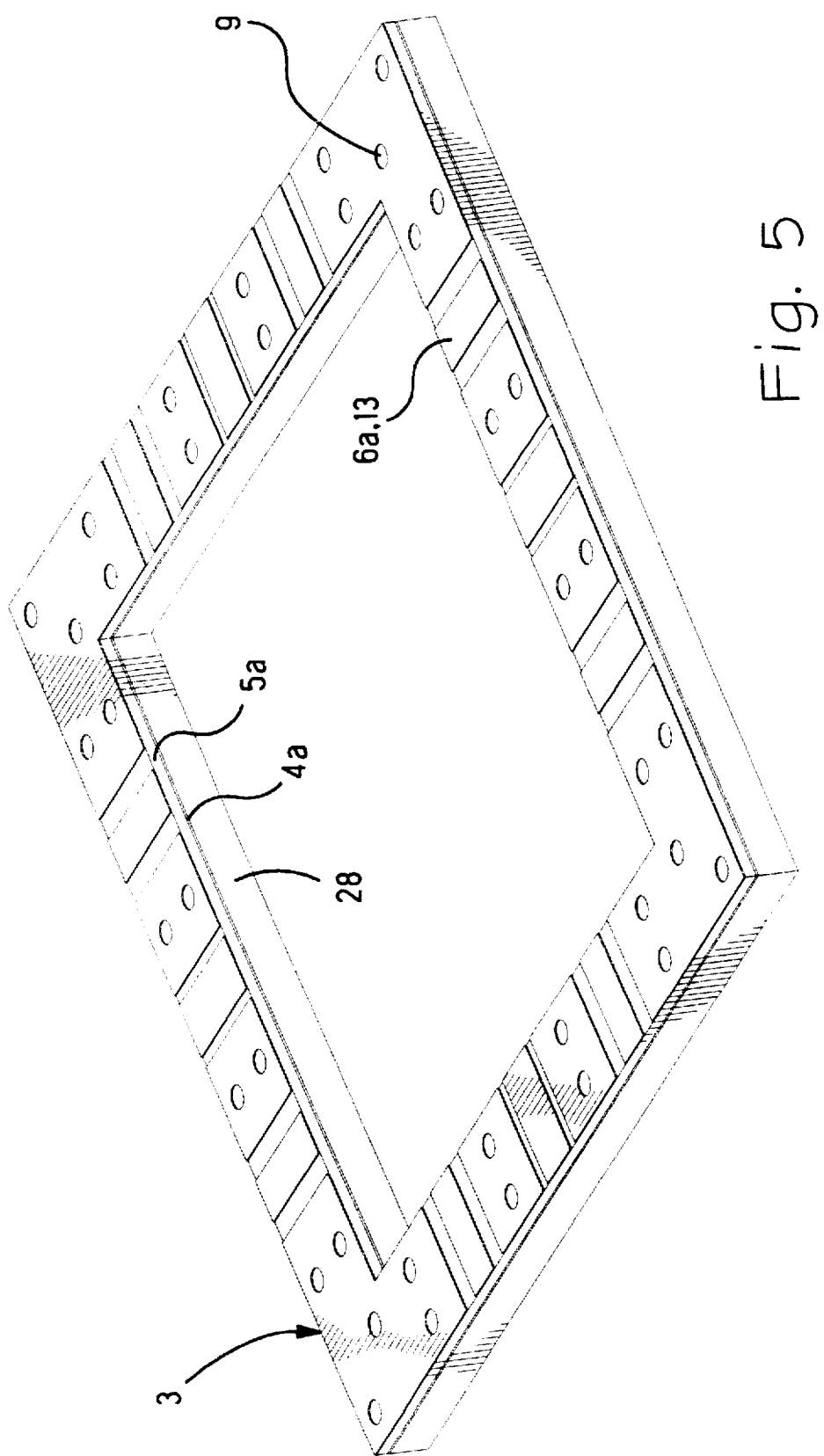
FIG. 5 is a perspective view of an inner interconnect with the side that engages an outer interconnect facing up.

With specific reference to FIGS. 1, 2 and 5 of the drawings, the inner interconnect (3) comprises a base layer (4a), insulating layer (5a), and transmission layer (6a). The base layer (4a) of the inner interconnect (3) is metal preferably copper with a thickness of approximately 20 to 45 microns. The insulating layer (5a) may be epoxyed or otherwise adhered to the base layer (4a) and is 20 to 45 microns thick. The transmission layer (6a) of the inner interconnect (3) comprises patterned metalized access lines (13) which in a preferred embodiment are gold plated copper traces approximately 5 to 20 microns thick. The inner interconnect (3) is epoxied onto a similarly shaped metal frame (28). The metal frame (28) has a thickness of approximately 20 thousandths of an inch and may be made of copper, a copper-molybdenum-copper alloy, a copper-tungsten alloy or a sintered or laminated structure of copper, molybdenum and/or tungsten.

In a wirebond embodiment, and with specific reference to FIG. 2, the outer interconnect (2) is circumferential to create a central cavity (7). The KOOL-BASE® lead structure may be stamped to create the appropriate geometry. The lead lines (8) of the outer interconnect (3) extend from an edge (10) of the central cavity (7) to a perimeter (11) of the outer interconnect (2). The inner interconnect (3) is similarly circumferentially formed to have a central cavity (12). The central cavity (12) of the inner interconnect (3), however, is smaller than the cavity (7) of the outer interconnect (2). A outer circumferential edge (29) of the inner interconnect (3) is larger than the central cavity (7) of the outer interconnect (2) and smaller than an area delineated by a package transition (31) of the outer interconnect (2). The access lines (13) extend from the inner edge (30) of the central cavity (12) to the outer circumferential edge (29) of the inner interconnect (3). The outer interconnect (2) and the inner interconnect (3) with frame (28) are adhered in fixed and concentric relationship to each other such that the inner interconnect (3) provides a shelf (15) to which a wirebond (14) may attach. The inner interconnect (3) is in electrical communication with the outer interconnect (2). Specifically, and with reference to FIGS. 5 and 6 of the drawings, the access lines (13) of the inner interconnect (3) are aligned to be in exclusive engagement with respective lead lines (8) of the outer interconnect (2). FIGS. 5 and 6 illustrate the mutually engaging sides of the inner and outer interconnects (2,3). Attachment of the access lines (13) to the lead lines (8) can be done by way of thermocompression bonding. It is preferred, therefore, that both the access lines (13) and the lead lines (8) be gold plated copper tracks. The result of the thermocompression bonding is that the lead lines (8) and respective ones of the access lines (13) become integral with each other to form a transmission path having a minimum transition in the area of mutual engagement between the inner and outer interconnects (2,3). The outer interconnect (2) and the inner interconnect (3) unit is then injection molded to form plastic package body (16). The outer interconnect (2) includes a number of mold relief areas (27) shown in FIG. 6 that permit molten plastic to flow to create the package body (16) and secure its position relative to the outer and inner interconnects (2,3). In the area of the lead lines (8) that transitions from an exterior of the package to an interior of the package through the plastic body (16), shown generally at (31), the lead line geometry may be modified and optimized to provide a constant transmission line impedance.

The package body (16) is open on a top (17) and bottom (18). A portion of the frame (28) is exposed on the bottom (18) of the package. In a wirebond embodiment, a metal carrier (19) may be stamped and is sized and shaped to fit on the bottom (17) of the package to adhere to the frame (28). An IC (20) is attached to a center of the carrier (19). The material of the carrier (19) is selected to be thermally matched to the IC (20). For a glass/silicon based microwave integrated circuit, an appropriate carrier (19) material is a copper-molybdenum-copper alloy which provides coefficient of thermal expansion compatibility to the integrated circuit (20). The integrated circuit (20), therefore, can be directly mounted onto the carrier (19). Thermal compatibility between the carrier (19) and the IC (20) advantageously provides for a certain degree of tolerance to thermal fluctuations.

A B-stage epoxy preform adheres the carrier (19) to a specific bottom of the frame (28) to provide a package seal. With reference to FIG. 9 of the drawings, contacts (21) on the integrated circuit (20) are wire bonded to the access lines (13) of the inner interconnect (3). A position translation is, therefore, provided by a package according to the teachings of the present invention to attach the upwardly facing integrated circuit (20) to the downwardly facing lead lines (8) with minimum perturbation in the electrical path from the integrated circuit (20) to the lead lines (8). It is further intended that the carrier (19) protrude from the package sufficiently so as to physically touch a printed wiring board (50) or other heat sinking surface when the package is surface mounted thereto. In this configuration, the thermal flow from the IC goes directly to the carrier (19) and eventually the printed wiring board (50) or other heat sinking surface. The thermal flow to the printed wiring board (50) or other heat sinking surface in this manner provides for improved heat dissipation over prior art packages. The other heat sink surface which is shown in FIGS. 2 and 3 of the drawings may be a metal boss (51) attached to a housing that receives the printed wiring board (50). Heat will conduct from the IC (20) to the carrier (19) and boss (51) for dissipation through the housing (not shown).

In a flip chip semiconductor embodiment, and with specific reference to FIGS. 3 and 10 of the drawings, the inner interconnect (3) and frame (28) are not circumferential rings, but rather are planar in form. The access lines (13) are patterned onto the inner interconnect (3) for receipt of a flip chip mounted integrated circuit (20a). Advantageously, there are no losses through a wire bond due to the direct connect of the flip chip mounted integrated circuit (20a) to the access lines (13). In this embodiment, it is a concept that the access lines (13) may perform an interconnection function between multiple ICs (20) mounted on the inner interconnect (3) to effect a circuit of a multichip module. The vias (9) may be formed between certain access lines (13) and the base layer (4a) of the inner interconnect (3). The vias (9) may interconnect the base layer (4) and the lead lines (8) of the outer interconnect (2) that are attached to ground potential. Similarly, the vias (9) may also interconnect the base layer (4a) and the access lines (13) of the inner interconnect (3) that are attached to ground potential. The number and placement of the vias (9) may be modified according to device specific considerations. The vias (9) are, therefore, used to create a coplanar waveguide transmission line structure. In the flip chip embodiment, since the frame (28) attached to the inner interconnect (3) performs a similar function to the carrier (19), a heat puck (23) may be attached to the frame (28) for improved heat dissipation as shown in FIG. 3 of the drawings. The metal puck (23) is disposed between the frame (28) and the printed wiring board (50) or other heat sink surface. In the flip chip embodiment, thermal flow is from the integrated circuit (20a) to the printed wiring board (50) or other heat sink surface by way of solder bumps (26), the access lines (13), the vias (9), the base layer (4a), the frame (28) and the heat puck (23).

An IC package for both the wire bond embodiment and the flip chip embodiment further comprises a cover (24) attached to the top of the package (1). Any known attachment method providing sufficient environmental seal may be used. If the cover (24) is plastic, a preferred attachment method is by way of ultrasonic weld. A plastic cover may also be metalized in order to provide electromagnetic interference shielding for the IC in the package. The cover (24) may also be shaped out of metal, which can be attached to the package by way of epoxy. In some cases, the metal or metalized cover (24) may be grounded for use in high EMI sensitivity applications. The leads (22) of the packaged IC are press formed to provide a radiused end (25). It has been found that a preferred range of lead radius is from about 20–40 thousandths of an inch with a typical radius being about 23 thousandths of an inch. The radiused end (25) is then ready for surface mount attachment to the printed wiring board (50) using conventional surface mounting printed wiring board manufacturing techniques.

In order to maximize electrical performance in a millimeter wave IC package, the lead lines (8) according to the teachings of the present invention provide a form of coplanar transmission line. Three adjacent leads comprise a single transmission line with the outer leads being attached to ground potential and the inner lead attached to signal. The vias (9) on the grounded leads electrically connect the grounded lead lines (8) or access lines (13) to the base layers (4, 4a) of the outer and/or inner interconnect (2, 3). The grounded base layer (4) of the outer interconnect (2) provides a ground plane for all leads of the semiconductor package at nearly the same voltage potential as the ground of the coplanar transmission line. The vias (9) may also be formed between grounded access lines (13) of the inner interconnect (3) and the base layer (4) of the inner interconnect (3) providing a similar ground plane. The carrier (19), frame (28), base layer (4a) of the inner interconnect (3), and the heat puck (23) also may be held at ground potential to achieve similar advantages.

Figure 12:
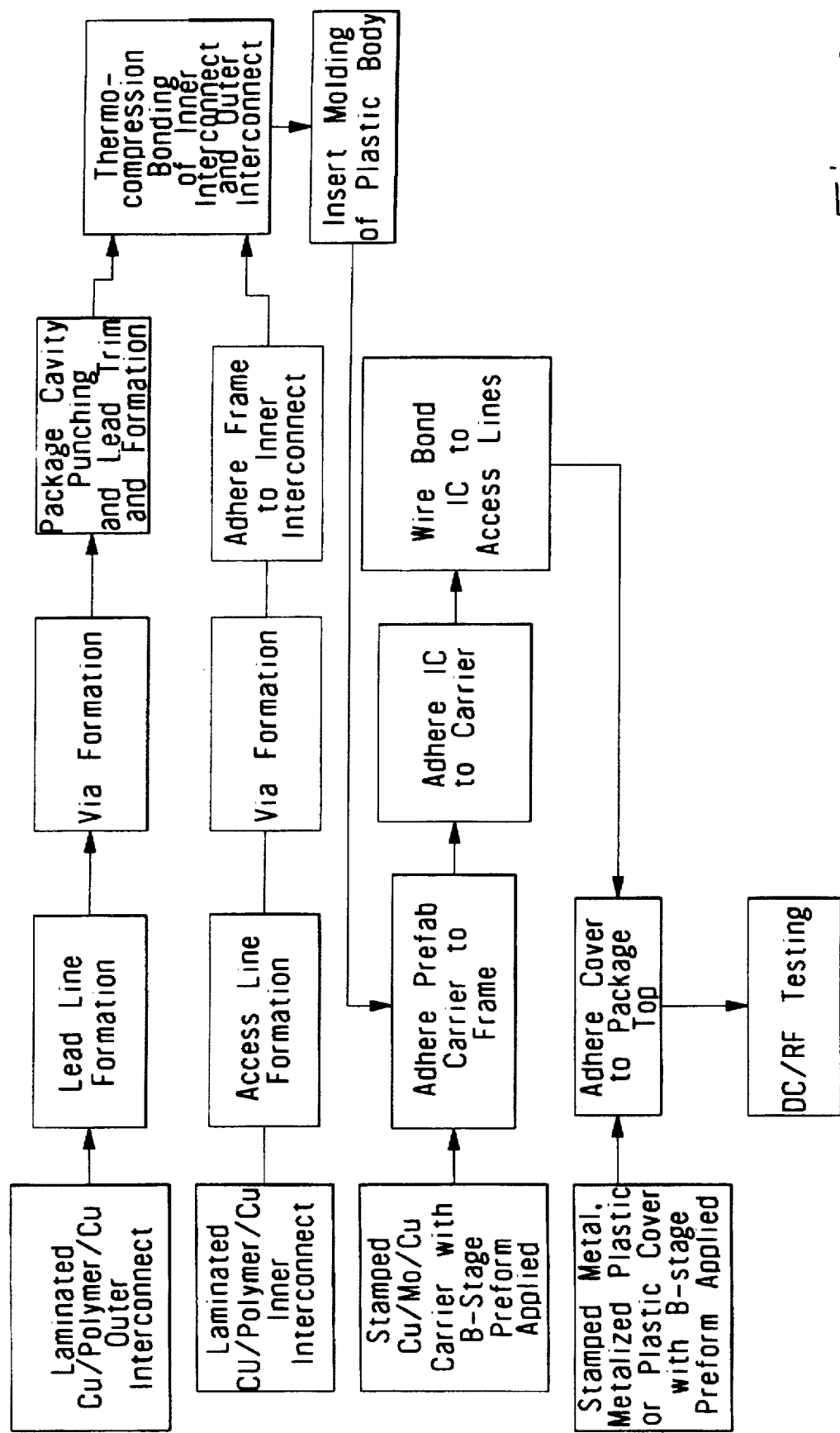
FIG. 12 is a flow chart of an assembly process for a packaged IC.
Figure 13:
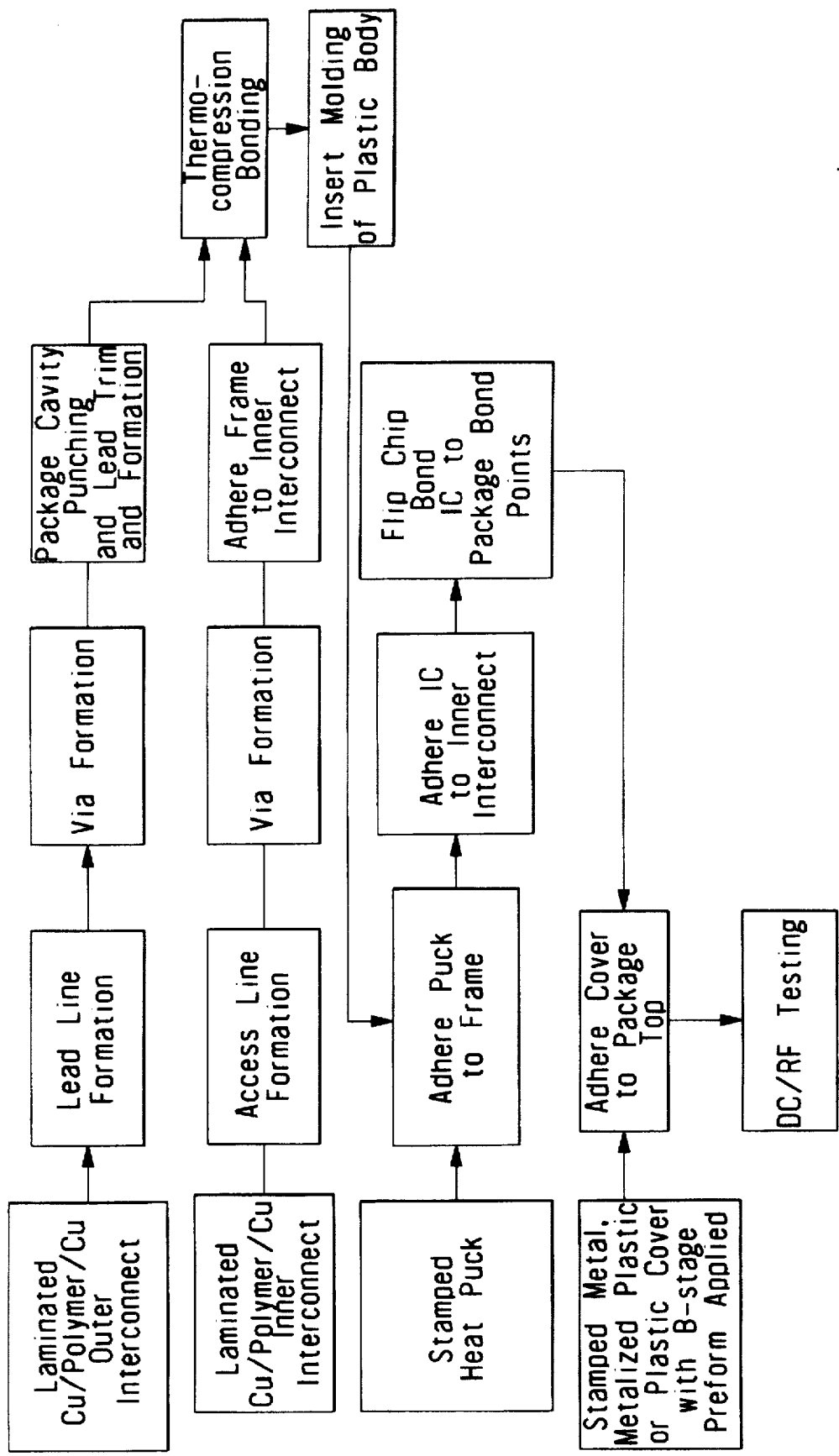
FIG. 13 is a flow chart of an alternate embodiment of an assembly process for a packaged IC.

The package fabrication process flow is represented in FIGS. 12 and 13 of the drawings. The outer interconnect (2) begins as a copper-polymer-copper laminate. The laminated lead structure is photoetched to delineate the desired placement and geometry of the lead lines (8). Optionally, certain of the lead lines (8) are then further processed to form grounding vias (9) between the lead lines and the base layer (4) of the outer interconnect (2). A central cavity (7) is stamped out of the etched outer interconnect (2) and a perimeter is trimmed and formed to provide radiused leads (22). The inner interconnect (3) is separately fabricated from a copper-polymer-copper laminate that is photo etched to create copper access lines. The access lines (13) are formed as a mirror image of corresponding lead lines (8) of the outer interconnect (2). Vias (9) may be formed between the base layer (4a) and certain ones of the access lines (13). The inner interconnect (3) is then adhered to a similarly profiled metal frame (28). The access lines (13) of the inner interconnect (3) are aligned with respective ones of lead lines (8) of the outer interconnect (2). The lead lines (8) and the access lines (13) are electrically interconnected in fixed relationship to one another by thermocompression bonding therebetween in order to form a bond plane translation. This monolithic structure of the outer interconnect (2) adhered to the inner interconnect (3) is injection molded to form a circumferential package body (16). Upon completion, the package body (16) is open on the top side (17) and the bottom side (18).

In a flip chip embodiment, the inner interconnect (3) is a separately fabricated planar member of metal with the insulating layer epoxyed or otherwise disposed on there and metalized access lines (13) patterned onto the insulating layer (5). In the flip chip embodiment, the metal frame (28) is has the same profile as the inner interconnect (3) and is epoxied onto the base layer (4a) of the inner interconnect (3) to create a package subassembly. The access lines (13) on the planar inner interconnect (3) are electrically attached and fixed relative to the outer interconnect (2) by thermocompression bonding.

A difference between the wire bond embodiment and the flip chip embodiment of an integrated circuit package according to the teachings of the present invention lies in the central cavity (12) formed in the inner interconnect (3). No such cavity is present in the flip chip embodiment of the inner interconnect (3). In a wire bond embodiment, a stamped metal carrier (19) forms a platform for the subsequent attachment of an integrated circuit or semiconductor assembly. A B-stage epoxy preform can be used to adhere the carrier (19) to the frame (28). In a flip chip embodiment, the heat puck (23) is adhered to the base of the inner interconnect on the bottom side (18) of the package. In both embodiments, it is intended that the carrier (19) or the heat puck (23) physically engage and be soldered to the printed wiring board (50) or other heat sink surface. The large metal mass of the frame/carrier/heat puck provides for efficient heat conduction from the IC (20, 20a) to the printed wiring board (50) or other heat sinking surface such as the boss (51). In the wirebond embodiment, the frame (28) is preferably a copper alloy. In the flip chip embodiment, the frame (28) is a copper-molybdenum-copper laminate structure.

The partially assembled package having the IC (20, 20a) mounted therein, is further processed to electrically interconnect the IC (20) to the access lines (13) of the inner interconnect (3). The electrical interconnection can be made by way of wire bonding contacts on the IC (20) to the access lines (13) or by flip chip bonding the IC (20a) directly onto the access lines (13) of the inner interconnect (3). The plastic or metal cover (24) is thereafter attached to the top side (17) of the integrated circuit package. If the cover (24) is plastic, it may be metalized to provide additional EMI shielding for the IC therein. DC/RF testing may then be performed.

Other advantages of the invention are apparent from the detailed description by way of example, and from accompanying drawings, and from the spirit and scope of the appended claims.

We claim:

1. A packaged IC comprising:
   an outer interconnect and an inner interconnect, said outer interconnect comprising a transmission layer including at least one conductive lead line, an insulating layer, and a base layer, said inner interconnect comprising a transmission layer including at least one conductive access line, an insulating layer and a base layer, said outer interconnect overlapping a portion of said inner interconnect and at least one lead line of said inner interconnect physically engaging and being electrically connected to respective ones of said at least one access line of said outer interconnect, and an IC having at least one contact, said at least one contact being electrically connected to said at least one access line of said inner interconnect.

2. A packaged IC as recited in claim 1 wherein said outer interconnect forms a ring which circumnavigates said inner interconnect.

3. A packaged IC as recited in claim 2 wherein said transmission layer of said outer interconnect further comprises lead lines and said transmission layer of said inner interconnect further comprises access lines and said lead lines electrically interconnect with said access lines.

4. A packaged IC as recited in claim 1 wherein each said transmission layer of said inner and outer interconnects comprises microstrip or coplanar transmission lines.

5. A packaged IC as recited in claim 1 wherein said at least one lead line has a geometry that varies over a package transition.

6. A packaged IC as recited in claim 5 and further comprising an injection molded package body around said inner and outer interconnects, said lead line geometry varying through said body.

7. A packaged IC as recited in claim 1 wherein said inner interconnect comprises a ring.

8. A packaged IC as recited in claim 7 and further comprising a carrier to which the IC is mounted.

9. A packaged IC as recited in claim 8 wherein a surface of said carrier plate is substantially coplanar with said transmission layer of said outer interconnect.

10. A packaged IC as recited in claim 1 wherein said inner interconnect is a planar member.

11. A packaged IC as recited in claim 10 wherein the IC is flip chip mounted to said planar inner interconnect.

12. A packaged IC as recited in claim 1 wherein a via electrically interconnects a lead line of said outer interconnect to said base layer of said outer interconnect.

13. A packaged IC as recited in claim 1 and further comprising a via electrically interconnecting said at least one access line with said base layer of said inner interconnect.

14. A packaged IC as recited in claim 1 wherein said base layer is electrically connected to signal ground.

15. A packaged IC as recited in claim 13 wherein said base layer is electrically connected to signal ground.

16. A packaged IC as recited in claim 8 wherein said carrier is thermally matched to the IC.

17. A packaged IC as recited in claim 10 and further comprising a frame engaging the inner interconnect.

18. A packaged IC as recited in claim 17 wherein, said frame is thermally matched to the IC.

19. A packaged IC as recited in claim 16 wherein said carrier is a copper-molybdenum-copper laminate and the IC is a glass based microwave integrated circuit.

20. A packaged IC as recited in claim 16 wherein said carrier is a copper-molybdenum-copper laminate or a copper-tungsten alloy and the IC is a glass based microwave integrated circuit.

21. A packaged IC as recited in claim 18 wherein said inner interconnect is a copper-molybdenum-copper laminate and the IC is a glass based microwave integrated circuit.

22. A packaged IC as recited in claim 18 wherein said inner interconnect is a copper-molybdenum-copper laminate or a copper-tungsten alloy and the IC is a glass based microwave integrated circuit.

23. A packaged IC as recited in claim 1 and further comprising a metalized cover.

24. A package for an IC comprising a package body and conductive leads extending through said body from an interior to an exterior of the package, said leads comprising an outer interconnect comprising a conductive base layer, an insulating layer, and a transmission layer including at least one lead line, and an inner interconnect comprising a conductive base layer, an insulating layer and a transmission layer including at least one access line, said at least one access line of said transmission layer of said inner interconnect overlapping and being electrically connected to said at least one lead line of said of said outer interconnect.

25. A package for an IC as recited in claim 24 wherein said base layer (4) is in electrical engagement with said transmission layer (6).

26. A package for an IC as recited in claim 25 and further comprising at least one via electrically interconnecting said transmission layer and said base layer of said inner interconnect.

27. A package for an IC as recited in claim 24 wherein said outer interconnect comprises a ring and further comprising a carrier disposed against said inner interconnect.

28. A package for an IC as recited in claim 24 and further comprising a heat puck disposed against said inner interconnect.

29. A package for an IC as recited in claim 24 and further comprising a cover (24) disposed on said body (16).

* * * * *